United States Patent
Brueck et al.

(10) Patent No.: US 7,656,912 B2
(45) Date of Patent: Feb. 2, 2010

(54) TUNABLE INFRARED LASERS FOR GAS-PHASE SPECTROSCOPY

(75) Inventors: Steven R. J. Brueck, Albuquerque, NM (US); Liang Xue, Albuquerque, NM (US); Ron Kaspi, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 135 days.

(21) Appl. No.: 12/056,454

(22) Filed: Mar. 27, 2008

(65) Prior Publication Data
US 2008/0240174 A1 Oct. 2, 2008

Related U.S. Application Data

(60) Provisional application No. 60/908,299, filed on Mar. 27, 2007.

(51) Int. Cl.
*H01S 3/10* (2006.01)
*H01S 3/08* (2006.01)

(52) U.S. Cl. .......................... 372/20; 372/96; 372/102

(58) Field of Classification Search .................. 372/20, 372/92, 96, 102
See application file for complete search history.

(56) References Cited

U.S. PATENT DOCUMENTS

| 5,241,556 | A * | 8/1993 | Macomber et al. ............ 372/96 |
| 5,450,427 | A * | 9/1995 | Fermann et al. ............... 372/10 |
| 5,834,158 | A * | 11/1998 | Hillmer ........................ 430/296 |
| 5,867,521 | A * | 2/1999 | Macomber ..................... 372/96 |
| 5,870,417 | A * | 2/1999 | Verdiell et al. ................. 372/32 |
| 5,970,081 | A * | 10/1999 | Hirayama et al. ............. 372/96 |
| 6,301,283 | B1 * | 10/2001 | Chen et al. ..................... 372/96 |
| 6,888,874 | B2 * | 5/2005 | Masood et al. ................ 372/96 |
| 2002/0181525 | A1 * | 12/2002 | Kasukawa ..................... 372/43 |
| 2004/0258119 | A1 * | 12/2004 | Shams-Zadeh-Amiri et al. . 372/45 |
| 2005/0078727 | A1 * | 4/2005 | Evans et al. ................... 372/50 |
| 2006/0140237 | A1 * | 6/2006 | Amarasinghe et al. ... 372/50.11 |
| 2006/0176915 | A1 * | 8/2006 | Evans et al. ................... 372/26 |

* cited by examiner

*Primary Examiner*—Minsun Harvey
*Assistant Examiner*—Phillip Nguyen
(74) *Attorney, Agent, or Firm*—MH2 Technology Law Group LLP

(57) ABSTRACT

Exemplary embodiments provide tunable laser devices, methods for making the laser devices and methods for tuning the laser devices. The tunable laser devices can include an optically pumped semiconductor laser heterostructure, on which a distributed-feedback (DFB) laser grating having variable grating spacings (or chirps) can be formed. The optically pumped semiconductor laser heterostructure can be an optically pumped type-II quantum well laser structure. The emission wavelength of the tunable laser devices can be tuned by changing positions of the region illuminated by the pump laser and with respect to the chirped DFB grating. The disclosed laser devices and methods can provide tunable laser emission with a combination of narrow linewidth and high output power that can be used for remote sensing applications and/or spectroscopic applications across the entire mid infrared (IR) spectral region.

24 Claims, 4 Drawing Sheets

TUNABLE INFRARED LASERS FOR GAS-PHASE SPECTROSCOPY

RELATED APPLICATIONS

This application claims priority from U.S. Provisional Patent Application Ser. No. 60/908,299, filed Mar. 27, 2007, which is hereby incorporated by reference in its entirety.

GOVERNMENT RIGHTS

This invention was made with government support under Contract No. 0515547 awarded by the National Science Foundation (NSF). The government has certain rights in the invention.

FIELD OF THE INVENTION

This invention relates generally to semiconductor laser devices and methods, and, more particularly, to tunable infrared laser devices, and methods for their fabrication.

BACKGROUND OF THE INVENTION

The infrared spectral region contains fundamental signature molecular absorptions that are important for gas sensing, environmental monitoring, chemical sensing and other applications. For example, high spectroscopic quality, compact, semiconductor-based laser sources can dramatically enhance the capabilities of active point and remote gas sensors for many applications including those that are commercial and defense/security related. Despite this importance and many years of effort, there are no tunable infrared laser sources that can provide continuous tuning across large spectral ranges in the infrared region with narrow linewidths suitable for gas-phase sensing, and high power for standoff/remote gas-phase sensing.

Thus, there is a need to overcome these and other problems of the prior art and to provide continuously tunable laser devices/sources that are robust, compact and suitable for spectroscopic applications.

SUMMARY OF THE INVENTION

According to various embodiments, the present teachings include a tunable laser device. The tunable laser device can include an optically pumped laser structure with a chirped distributed feedback (DFB) grating disposed thereon, and a pump laser disposed to provide a pump beam illuminating a specific area within the total area covered by the chirped DFB grating. The position of the pump beam can be changed to allow a continuous tuning of a lasing emission wavelength from the optically pumped laser structure.

According to various embodiments, the present teachings also include a method for tuning a laser emission wavelength. In this method, a chirped distributed feed-back (DFB) grating can be formed on an optically pumped laser structure using an interferometric lithography or other suitable lithographic technique. The laser emission wavelength can be tuned by changing a position of a pump beam that is relative to the optically pumped laser structure containing the chirped DFB grating thereon.

According to various embodiments, the present teachings further include a laser source for gas sensing. The laser source can include a chirped DFB grating disposed on an optically pumped laser structure emitting in the mid-IR wavelength range. The laser source can further include an optical arrangement including a pump beam that samples the chirped DFB grating at different locations such that a single longitudinal mode emission can be tuned to perform spectroscopy of absorbing media of interest.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1A:
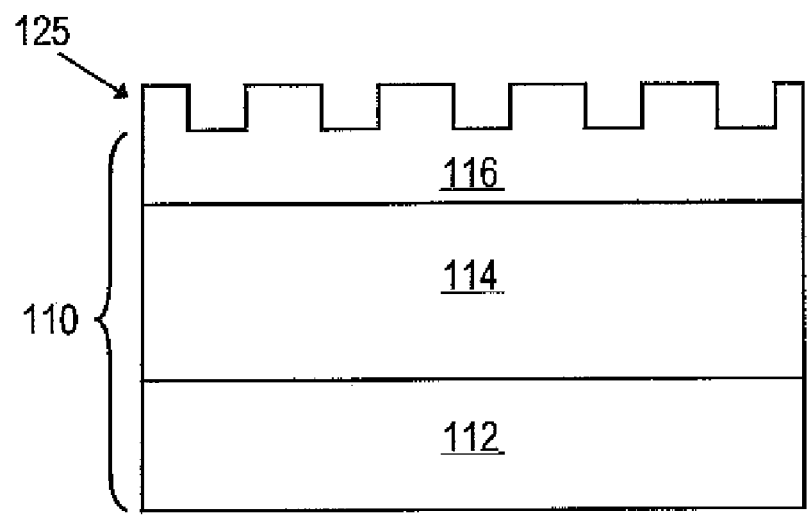
FIG. 1A depicts an exemplary laser device in accordance with the present teachings.

Reference will now be made in detail to the present embodiments (exemplary embodiments) of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume values as defined earlier plus negative values, e.g. −1, −1.2, −1.89, −2, −2.5, −3, −10, −20, −30, etc.

Exemplary embodiments provide tunable laser devices, methods for making the laser devices and methods for tuning the laser devices. The tunable laser devices can include an optically pumped semiconductor laser heterostructure, on which a distributed-feedback (DFB) laser grating having variable grating spacings (or chirps) can be formed. The optically pumped semiconductor laser heterostructure can be an optically pumped type-II quantum well laser structure. The emission wavelength of the tunable laser devices can be tuned by changing positions of an illuminated region by the pump laser and with respect to the chirped DFB grating. That is, the combination of optical pumping and the use of a chirped grating can allow the disclosed wavelength tuning scheme. The disclosed laser devices and methods can provide tunable laser emission with a combination of narrow linewidth and high output power that can be used for remote sensing applications and/or spectroscopic applications across the entire mid infrared (IR) spectral region.

For example, the disclosed laser devices can be capable of continuous wave (CW) tunable output in the mid-IR spectral region. In various embodiments, the disclosed laser devices can provide a high output power of about 300 mW per facet or higher, in some cases, of about 560 mW/facet or higher, where a narrow linewidth can be of about 0.17 nm to about 1.2 nm, such as a linewidth of about 1-nm for a single-longitudinal-mode (SLM) operation.

Figure 1B:
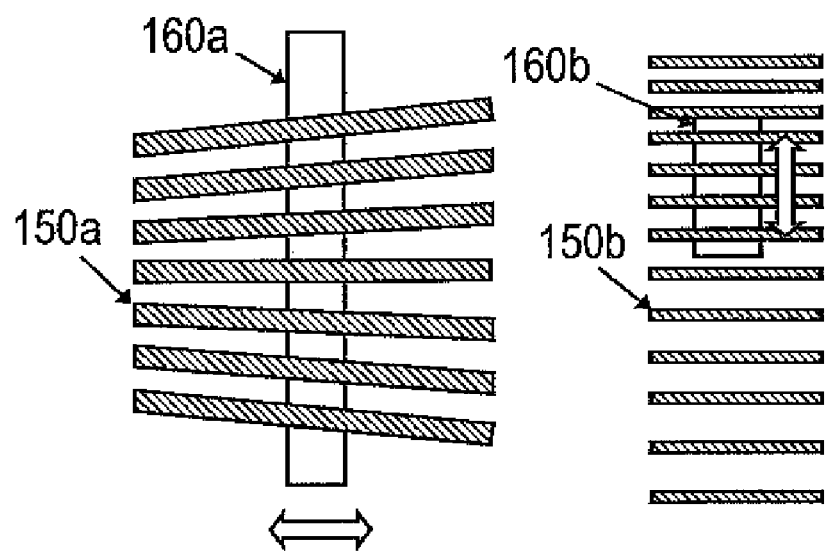
FIG. 1B depicts an exemplary optical arrangement for tuning the laser device in FIG. 1A in accordance with the present teachings.

FIGS. 1A-1B depict an exemplary tunable laser device in accordance with the present teachings. Specifically, FIG. 1A is a schematic cross sectional view of the exemplary laser device 100A, while FIG. 1B depicts an exemplary optical arrangement 100B for tuning the optical output of the laser device 100A in accordance with the present teachings. It should be readily apparent to one of ordinary skill in the art that the device 100A and the optical arrangement 100B depicted in FIGS. 1A-1B represent generalized schematic illustrations and that other layers/structures/optical arrangements can be added or existing layers/structures/optical arrangements can be removed or modified.

As shown in FIG. 1A, the device 100A can include an optically pumped laser structure 110 and a DFB grating (layer) 125 fabricated in a top clad layer 116 of the laser structure 110.

In FIG. 1A, the optically pumped laser structure 110 can be an optically pumped type-II quantum well laser, for example, having a layered structure including a bottom waveguide clad layer 112, a quantum well active region 114, and the top waveguide clad layer 116. As illustrated in FIG. 1A, the quantum well active region 114 can be disposed between the bottom clad layer 112 and the top clad layer 116. In various embodiments, the type-II quantum well structure 110, specifically, the bottom clad layer 112, can be formed on a substrate (not shown), for example, a silicon substrate or a III-V semiconductor substrate including such as GaSb, InAs or InP. The type-II quantum well structure 110 can be epitaxially grown by, for example, molecular beam epitaxy or other suitable techniques used as known to one of ordinary skill in the art.

The bottom clad layer 112 of the optically pumped laser structure 110 can include one or more materials chosen from, for example, GaSb, AlGaSb, AlAsSb, AlGaAsSb, InAlAsSb, GaAlAsSb, AlSb, AlInSb, AlSbAs, or AlGaSbAs. In various embodiments, the bottom clad 112 can include, for example, alternating layers of such as AlSb and AlGaSb, or GaAs and AlGaAs.

The quantum well active region 114 can be a multiple quantum well (MQW) active region formed over the bottom clad layer 112. The quantum well active region 114 can be a type-II quantum well active region including at least one quantum well layer where the hole and electron optical recombination process can take place. The type-II quantum well active region 114 can include semiconductor layers, e.g., alternating semiconductor layers, chosen from, e.g., InAs/GaSb, InAs/GaAsSb, InAs/GaInSb, InAsSb/GaInSb, InGaAs/GaInSb, InAs/GaInSb/InAs, InAs, InAsSb, InGaAs, InGaAsSb, GaSb, GaInSb, AlGaSb, or AlGaInSb. Alternatively, the type-II quantum well active region 114 can include quantum wells that are imbedded in a semiconductor matrix, chosen from, e.g., InGaAsSb, AlGaAsSb, GaSb, InAs, or AlGaInSb, utilized for the purpose of optical absorption of the pump photons and the subsequent injection of these photo-excited carriers into the wells.

The top clad layer 116 can be a spacer layer formed on the quantum well active region 114 and include a material chosen from, for example, GaSb, AlGaSb, AlAsSb, AlGaAsSb, InAlAsSb, GaAlAsSb, AlSb, AlInSb, AlSbAs, or AlGaSbAs. In some embodiments, the top clad layer 116 can include, for example, alternating layers of such as AlSb and AlGaSb, or GaAs and AlGaAs. These cladding materials can be transparent to the pump photons so that absorption of the pump photons can take place exclusively in the active region 114. In various embodiments, the clad layer 116 can be used to absorb pump photons for subsequent injection of photo-excited carriers into the quantum wells.

In various embodiments, the layered quantum optically-pumped laser structure 110 can be operated by illumination with a pump beam generated from a pump laser for an optical emission of the laser structure 110. For example, the absorbing matrix in the quantum well active region 114 can undergo hole and electron optical excitation processes by the photon energy of the pump laser beam. In an exemplary embodiment, a type-II InAs/InGaSb quantum well laser structure itself (i.e., without the DFB grating 125 formed thereon) can have, for example, a spectral coverage of a band of about 100 nm designed within the spectral region from about 3 μm to about 9 μm with a peak output power of several Watts. By using a number of such laser structures, coverage across the entire 3- to 9 μm region can be achieved. It is discovered that this coverage can be extended both to shorter and to longer wavelengths, which are required for specific spectroscopic applications.

In various embodiments, the optically pumped laser structure 110 can include an edge emitting laser configuration that includes one or more semiconductor edges or lasing facets (not shown) as known to one of ordinary skill in the art. Each lasing facet can further include one of an anti-reflection coating to improve the transmission of the laser output beam, or a high reflectivity coating to direct the lasing emission back into the laser cavity and thereby reduce the threshold. In one embodiment, it is desirable to reduce the impact of the lasing facets relative to the effects of the DFB grating structure and the coatings can be appropriately adjusted. In another embodiment, the grating lines of the DFB structure and the long dimension of the optically pumped region can be rotated with respect to the laser facets to reduce the impact of the facets on the lasing wavelength.

The optically pumped quantum well laser structure 110, e.g., a type-II InAs/GaSb laser structure, can provide advantages for the final device 100A, such as when used for spectroscopic applications. For example, the optically pumped type-II quantum well structure 110 can provide improved mode quality and brightness because a large optical cavity can be provided by optical pumping for a reduced free-carrier absorption as compared with electrical pumping. In addition, the exemplary optically pumped type-II quantum well structure 110 can be continuously tuned by forming a chirped DFB grating layer thereon to form the disclosed laser device 100A as shown in FIG. 1A. The tuning process can be performed by adjusting the position of the pumped region with respect to the grating period which varies from one end to the other of the grating structure.

As disclosed herein, the term "grating" refers to a structure that has a periodic line/space structure. A grating period can include a grating line and an adjacent spacing (e.g., to an adjacent grating line of the grating). In various embodiments, a center-to-center spacing between two adjacent grating lines can be defined as a grating pitch or period. In general, the overall grating structure can have large dimensions as compared with grating pitch. In various embodiments, the grating can have lateral dimensions as large as that of the semiconductor laser structure (e.g., 110 as shown in FIG. 1A). In an embodiment where continuous tuning is not required, a plurality of gratings can be included in the device 100A to "digitally" tune the emission wavelength by switching the optical pump illumination from one grating to another. In this case, each grating can have a fixed grating period.

As disclosed herein, the term "chirped grating" refers to a grating in which the grating period of line/space is a continuous function of position within the grating structure. That is, the grating period of a chirped grating can be spatially varying. The spatial scale of the variation can be large as compared with the spacing between two adjacent grating lines.

Referring back to FIG. 1A, the DFB grating 125 can be formed in the top clad layer 116 of the exemplary optically pumped type-II quantum well laser structure 110.

The parameters of the DFB grating 125 can be adjusted to the desired spectral tuning range from the laser device. In particular, the grating period, p, can be related to the lasing wavelength by the equation of $\lambda = 2 n_{mode} p$, where $n_{mode}$ can be the modal index associated with the laser waveguide formed by the quantum well active layers (114) and the cladding layers (112 and 116) and the depth of the grating along with the details of the epitaxial structure that controls the coupling constant κ. It is usually desirable to have a product of κ and the length of the illuminated gain region, L, e.g. κL around 1 to 5. Similarly, in order to maintain a narrow linewidth, the chirp of the grating structure (125) over the width of the illuminated gain region should not be too large. The interplay between this requirement in relation to the required spectral width for the spectroscopic application, the total size of the semiconductor wafer, and the gain bandwidth of the semiconductor gain region can determine the tuning range for a specific embodiment.

In a specific embodiment, the DFB grating 125 can have a spatially-varying grating period, e.g., ranging from about 580 to about 604 nm and the grating line can have a depth, e.g., ranging from about 100 nm to about 1500 nm. In various embodiments, the cross section of the grating lines can be maintained more or less constant while the spacing between them varies across the full grating area. For example, a top view of the plurality of grating lines can include a series of hyperbolic sections rather than the straight lines of a constant period grating.

In various embodiments, the DFB grating 125 can be a 1-D Bragg grating fabricated in the top clad layer 116 or a cap layer over the optically pumped type-II quantum well structure 110. The DFB grating can be formed by patterning the top clad layer 116 using, e.g., an interferometric lithography or other suitable lithographic technique, and etching the patterned clad layer using, e.g., an inductive coupled plasma (ICP) etching technique that is known to one of ordinary skill in the art.

By controlling the variants during the interferometric lithography (e.g., controlling wavefronts using optical systems), various desired chirps can be obtained for the DFB grating 125 to include a range of grating periods. In various embodiments, a plurality of DFB gratings can be formed on the laser structure 110, wherein each DFB grating has a fixed grating period.

Figure 2:
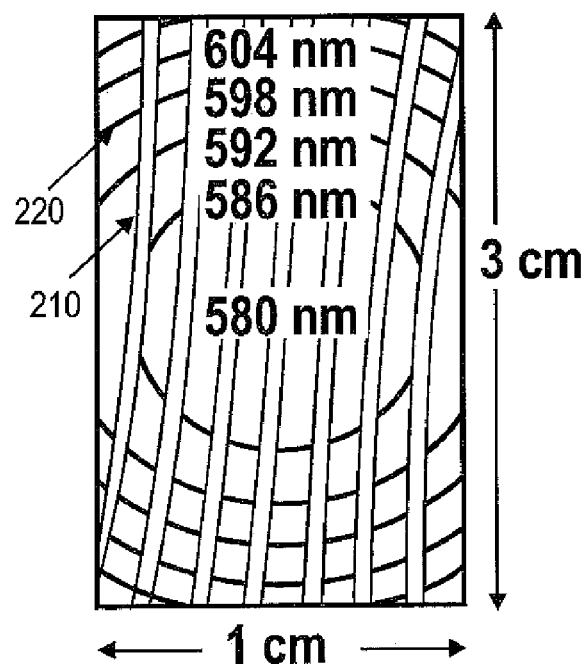
FIG. 2 depicts an exemplary design for DFB gratings in accordance with the present teachings.

FIG. 2 depicts an exemplary design for a chirped grating 210 from interferometric lithography and their equal-period contours 220 in accordance with the present teachings. As shown in FIG. 2, the exemplary design of the chirped grating 210 can include a series of hyperbolae formed from an interference pattern. Local grating period values for the chirped grating 210 are also marked in FIG. 2 indicating the exemplary grating period changing from about 580 nm at the sample center to about 604 nm at the sample edge with a distance therebetween of about 1.5 cm. In various embodiments, the interference pattern can be obtained from an optical interference between two spherical waves as shown in FIG. 3.

Figure 3:
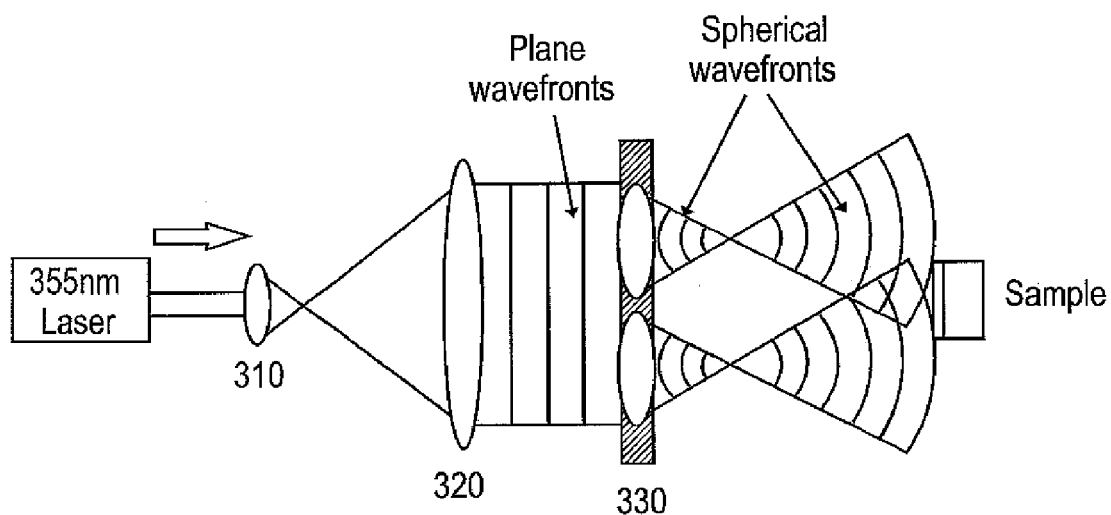
FIG. 3 depicts an exemplary lithography setup for fabricating the DFB gratings in accordance with the present teachings.

FIG. 3 depicts an exemplary lithography setup in accordance with the present teachings. As depicted in FIG. 3, simple lens systems 310, 320 and 330 can be used to control wavefronts, e.g., to transform a plane wave incident into two spherical symmetric waves, of the interferometric lithography. The interference between the two spherical waves can produce a periodic spatially-varying intensity pattern. Such pattern can be transferred onto, e.g., the top clad layer 116 of the quantum well laser structure 110 and thus form the plurality of grating lines by an etching step as shown in FIG. 1A. In various embodiments, the optics for the interferometric lithography can be adjusted to control the grating style of the plurality of grating lines and thus to control the chirp of the grating 125 in a DFB mode.

Other approaches suitable for the fabrication of the gratings layer 125 can include, for example, electron-beam lithography, or a combination of the electron-beam lithography with nanoimprint techniques. For example, e-beam lithography can be used to write a master grating, which is then reproduced by nanoimprint techniques. This combination can provide an advantage that only one e-beam is required to write the master grating and the reproduction can be made by much less expensive techniques. Alternatively, interferometric lithography can be combined with the nanoimprint techniques. For example, interferometric lithography can be used to fabricate the imprint master for the nanoimprint approaches. In various embodiments, other lithography techniques such as an optical lithography can also be used to fabricate the DFB grating 125.

In various embodiments, by use of the DFB grating 125 on the quantum well laser structure 110, the optically pumped laser device 100A of FIG. 1A can be used for spectral mode selection. For example, FIG. 4 depicts that single spectral mode emission can be achieved in devices (such as device 100A) operating near threshold due to the addition of the DFB grating(s) over the laser structure, even without anti-reflection coatings on the lasing facets.

Figure 4:
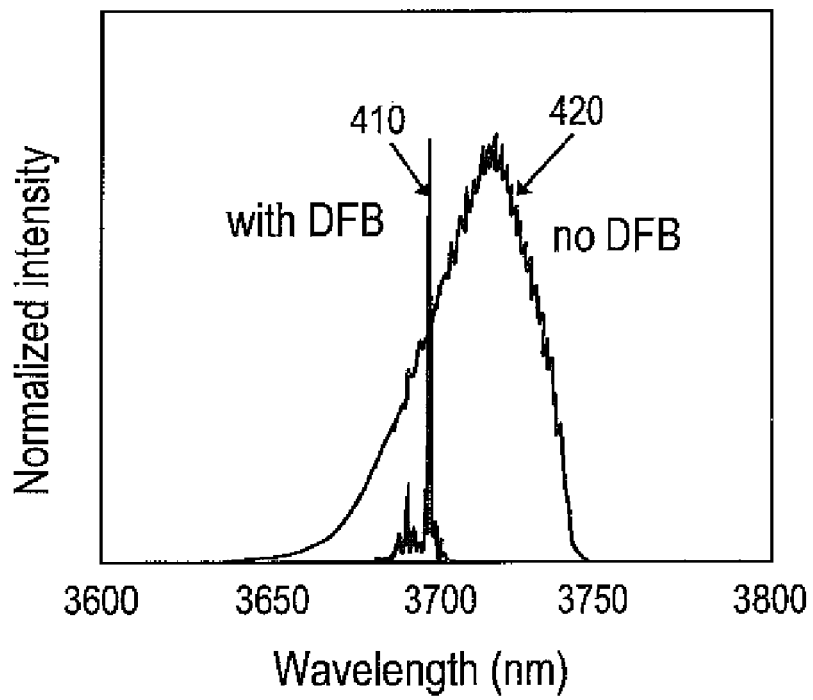
FIG. 4 compares output spectra for devices with or without a chirped DFB grating in accordance with the present teachings.

Specifically, FIG. 4 compares emitting spectra for devices that are with the DFB grating (see curve 410) and without the DFB grating (see curve 420) in accordance with the present teachings. As shown in FIG. 4, the device, for example, having type-II quantum well active structure but omitting the DFB grating layer, can have an output laser wavelength within a spectral bandwidth range of about 80 nm as shown from curve 420. On the contrary, when the disclosed DFB grating layer is formed over the exemplary type-II quantum well active structure, the device (e.g., the laser device 100A in FIG. 1A) can significantly narrow the output laser spectrum for a narrow linewidth of, e.g., about 0.17 nm to about 1.2 nm.

Referring back to FIGS. 1A-1B, the device 100A in FIG. 1A can be continuously tuned using the exemplary optical arrangement 100B shown in FIG. 1B.

The exemplary optical arrangement 100B can include a transversely-chirped grating 150a in reference to a pumped region 160a, and/or a longitudinally-chirped grating 150b in reference to a pumped region 160b. In various embodiments, the chirped gratings 150a-b can be the chirped DFB grating 125 of the laser device 100A in FIG. 1A, while the pumped regions 160a-b can be regions of the device 100A wherein the pump laser illumination is provided.

In an exemplary embodiment, the pump beam (not shown) can illuminate the optically pumped laser structure (e.g., 110 in FIG. 1A) from its top through the chirped DFB grating (150a-b or 125 in FIG. 1A) at the pumped region 160a-b. Alternatively, the pump laser illumination can be provided from the bottom of the device, opposite to location of the chirped DFB grating (150a-b or 125). For example, the pump beam can illuminate a "sub-area", i.e., a specific area within the total area covered by the chirped DFB grating.

The chirped DFB grating (150a-b or 125) can contain a continuously varying spacing (chirp) and can be considered to provide a plurality of grating periods, grating spacings or grating pitches to a plurality of optically pumped regions (160a-b) if the position of the pump beam is varied over the laser structure. Alternatively, the chirped DFB grating can include a number of discrete fixed grating periods to provide a plurality of different but fixed grating spacings to the plurality of optically pumped regions (160a-b) for a "digital" tuning.

As disclosed herein, the term "transversely chirped grating" refers to a chirped grating in which the variation of the grating period is parallel to the grating lines. The term "longitudinally chirped grating" refers to a chirped grating in which the chirp is perpendicular to the grating lines (i.e., the layer of the grating). In various embodiments, the disclosed laser device can include one or more of longitudinal chirps and transverse chirps.

For the transversely-chirped grating, the resulting wavelength can be tuned by simply translating the pump laser beam 160a left and right in the plane of the indicated page (i.e., in a parallel direction in reference to the layer of the grating 150a) and the laser output can be in the vertical direction (e.g., up and down to the plane of the indicated page or the grating layer). That is, the feedback provided by the distributed feedback DFB grating can be perpendicular to the layer of the DFB grating, while the chirp in the chirped grating can be provided in a direction orthogonal to the grating lines.

For the longitudinally-chirped grating, the resulting laser wavelength can be tuned by translating the pump region in a vertical direction in reference to the layer of the grating 150b (e.g., up and down to the plane of the indicated page). As a result, the output laser beam can be directed normal to the plane of the grating (e.g., out of the plane of the figure) while the chirp is provided in the vertical direction (e.g., up and down to the plane of the indicated page). In other words, the feedback provided by the distributed feedback DFB grating can be perpendicular to the layer of the grating lines, while the direction of the chirp in the chirped DFB grating can also be perpendicular to the grating for the longitudinal chirp. In this case, the grating period can be adjusted to provide both feedback (in second order) and to provide the output coupling normal to the plane of the grating layer or the clad layer (in first order).

In this manner, a tuning over a wide spectrum can be obtained by agilely translating the pump laser beam. The grating spacing/period/pitch in the DFB grating can determine laser emission wavelengths due to the many weak reflections at each grating line, which can add up in phase at a specific wavelength to give a large overall reflectivity. The optically illuminated area (or pumped region 160 a-b in FIG. 1B) of the semiconductor heterostructure (or the laser structure 110 in FIG. 1A) can determine the active region of the lasing mode. For example, in a typical edge emitting laser operation, the fixed optically illuminated area can sample a small portion of the grating and therefore a small range of DFB spacing/period/pitch. Changing the position of the illuminated area (or the pumped region) can change the grating spacing/period/pitch in the active region and thereby change the wavelength. In various embodiments, the pump beam can be rotated with respect to the lasing facets of an optically pumped edge emitting laser structure in order to sample a plurality of varying grating pitches within the chirped DFB grating. Therefore, moving the pump beam relative to the chirped DFB device can be a mechanism by which the laser emission wavelength can be tuned. This chirped DFB tuning scheme applied to optically pumped type-II quantum well lasers can provide optical gain in the mid-infrared (mid-IR) spectral region.

Note that when the tuning element (i.e., the optical pumping, or the pump laser) is integrated onto the tunable laser device, the emitted light wavelength can be inherently insensitive to external vibrations, which provides robustness to the disclosed tunable laser device. For example, type-II InAs/InGaSb DFB grating laser devices can be operated at any wavelength between 2.5 μm and 12 μm, when they are optically pumped at 1.9-μm. Hence, changing wavelengths over the entire IR spectral coverage can be accomplished by redirecting the pump beam to a multiplicity of devices and to a different region of the chirp within each said device (e.g., the device 100A). As such, the chirped grating DFB tuning approach as described in FIGS. 1A-1B can provide a compact and robust system for laser wavelength selection and tuning.

The chirped DFB gratings and the direction of the illuminated area can be tilted with an angle, e.g., about 6°, to the laser facets to reduce Fabry-Perot effects. In some embodiments, antireflection coatings on the facets can be used for similar purposes. In other embodiments, both tilting of the DFB grating and the illuminated area, and antireflection coatings can be employed.

Figure 5A:
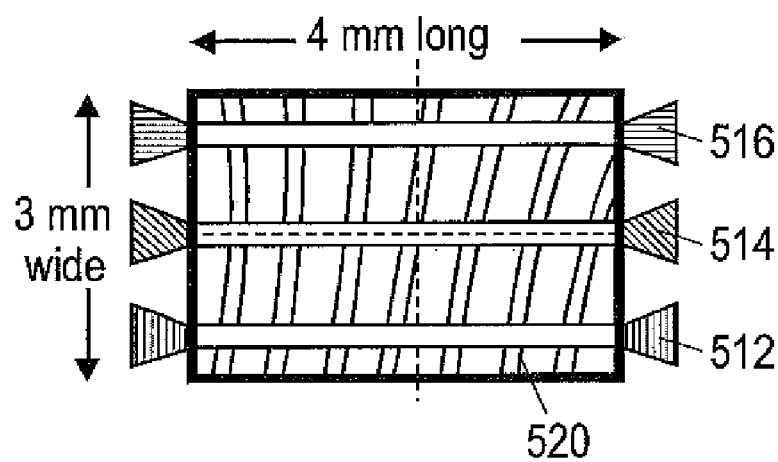
FIG. 5A is a schematic for an exemplary continuous tuning process using the optical arrangement of FIG. 1B in accordance with the present teachings.
Figure 5B:
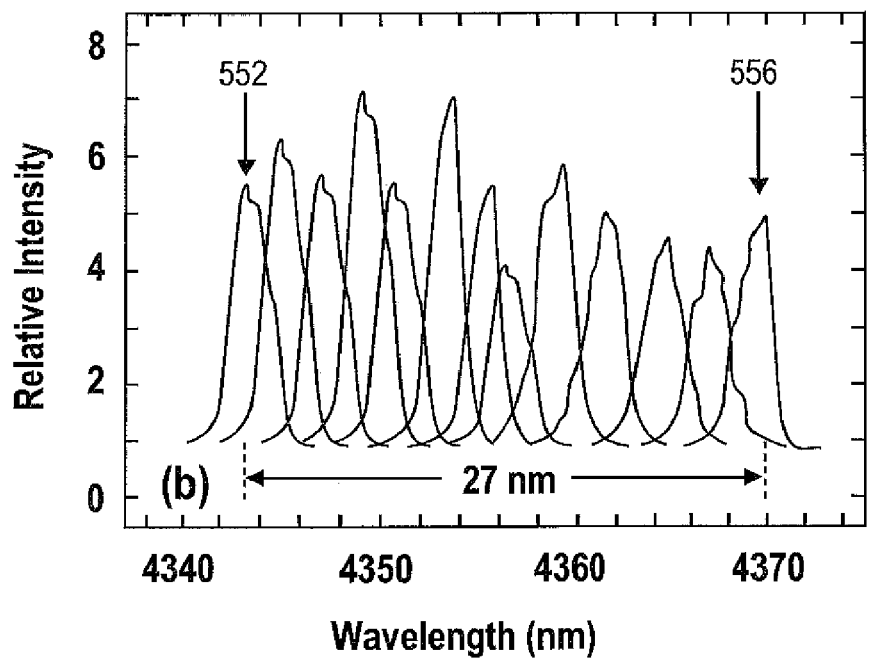
FIG. 5B depicts exemplary spectral measurements during the tuning process shown in FIG. 5A in accordance with the present teachings.

FIG. 5A is a schematic for an exemplary continuous tuning process using the disclosed optical arrangement with respect to the DFB gratings in accordance with the present teachings. FIG. 5B are exemplary spectral measurements during the continuous tuning process as shown in FIG. 5A.

In FIG. 5A, exemplary pump strip locations 512, 514, and 516 indicate position changes of a pump laser beam in reference to the grating 520 in a DFB mode operation of the laser device 100A. Note that although three locations 512, 514 and 516 are included in FIG. 5A for illustrative purpose, one of ordinary skill in the art will understand that the pump laser beam can be positioned continuously in a serious of locations corresponding to the grating 520 to tune the optical emission of the laser device 100A.

In this example, the chirped DFB grating laser device (e.g., the device 100A) is about 4×3 mm$^2$ having a 4-mm-cavity operated in a single-longitudinal-mode. A pump laser beam at 1.9 micron is used. The grating 520 is fabricated having a depth of about 1300 nm. FIG. 5B shows spectral measurement results conducted with a spectral resolution of about 0.2 nm. As shown, the output lasing wavelength can be continuously tuned between about 4343 nm at 552 of FIG. 5B, when the pump region is at the location 512 in FIG. 5A, and about 4370 nm at 556 of FIG. 5B, when the pump region is at the location 516 in FIG. 5A. Such spectral measurement results can indicate an exemplary wide wavelength tuning of about 27 nm (14 cm$^{-1}$) between about 4343 nm and about 4370 nm, when using the pump laser beam at about 1.9 µm for this 4-mm-long laser device. In various embodiments, the continuous tuning range can be of about 100 nm or broader when using a wider laser device.

Figure 6:
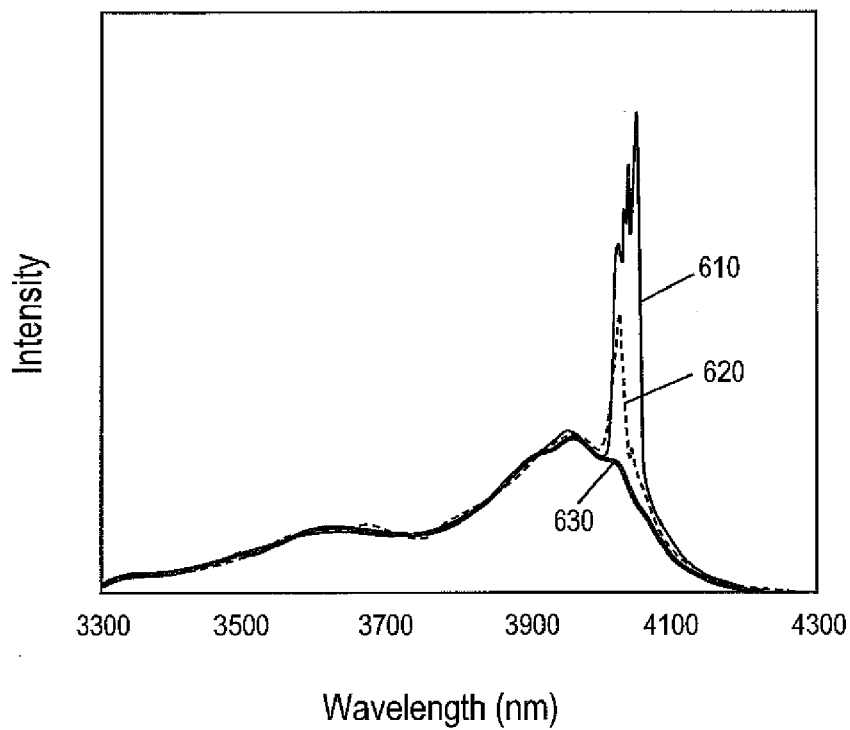
FIG. 6 depicts broad gain spectrum of an exemplary two-partition laser device in accordance with the present teachings.

In various embodiments, multiple heterogeneous quantum well structures 110 of FIG. 1A can be used to adjust a gain bandwidth within a single gain region. This is because all of quantum well structures can be sufficiently populated so that the gain bandwidth can be made broader. For example, a plurality of slightly different quantum well structures can be placed in partitions optically connected (but electrically separated) in order to provide a wide tunability for the disclosed optically pumped DFB laser devices for spectroscopic applications, e.g., to provide frequency agility during a frequency scanning. FIG. 6 compares spectral output 630 from a laser device that has two sets of quantum well structures, with the spectral output 610 or 620 from a device having the individual quantum well structure of the two-sets of quantum well structures in accordance with the present teachings. As shown, lasing for 610, 620 and 630 can all occur at a wavelength of about 4.05 µm. However, the resulting gain bandwidths can be different. Specifically, broad gain bandwidth of about 600 nm wide from about 3.5 micron to about 4.1 micron in the IR region can be obtained for the exemplary two-partition device as compared with the device that has single quantum well structure.

In various embodiments, the disclosed laser configuration as described in FIGS. 1A-1B, e.g. the exemplary integrated DFB/DBR grating configuration, can be used for spectroscopic applications (e.g., sensors) as laser sources. For example, the laser source for gas sensing can include a chirped DFB grating disposed on an optically pumped laser structure emitting in the mid-IR wavelength range. The laser source can further include an optical arrangement including a pump beam that samples the chirped DFB grating at different locations such that a single longitudinal mode emission can be tuned to perform spectroscopy of the absorbing media of interest.

Such optical pumped semiconductor (e.g., InAs/GaAsSb) lasers can be compact, robust, and continuously tunable. It should be appreciated that, while laser devices, optical arrangements, and methods have been described in conjunction with exemplary spectroscopic systems, devices, optical arrangements, and methods according to this disclosure are not limited to such applications. For example, the disclosed laser device can also be used for biomedical or marking applications with high average output power and good output beam quality in order to yield high brightness.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A tunable laser device comprising:
   a chirped distributed feedback (DFB) grating disposed on an optically pumped laser structure; and
   a pump laser disposed to provide a pump beam illumination in a sub-area with respect to an area covered by the chirped DFB grating, the position being changed to allow a continuous tuning of a lasing emission wavelength from the optically pumped laser structure.

2. The device of claim 1, wherein the chirped DFB grating provides a feedback essentially perpendicular to grating lines of the chirped DFB grating while a chirp is principally arranged in a direction parallel to the grating lines of the chirped grating DFB grating.

3. The device of claim 1, wherein grating lines of the chirped DFB grating are arranged at a tilt to one or more edges of the optically pumped laser structure to reduce an impact of any Fabry-Perot resonances on the lasing emission.

4. The device of claim 1, wherein the chirped DFB grating provides a feedback essentially perpendicular to grating lines of the chirped DFB grating while a chirp is principally arranged in a direction perpendicular to the grating lines of the chirped DFB grating.

5. The device of claim 4, wherein the chirped DFB grating further comprises a grating period adjusted to provide the feedback and to provide an output coupling normal to the plane of the chirped DFB grating.

6. The device of claim 1, wherein the pump beam is provided from a top side of the optically pumped laser structure that is through the chirped DFB grating or from a bottom side of the optically pumped laser structure that is opposite the chirped DFB grating.

7. The device of claim 1, wherein the chirped DFB grating is formed by etching into a material of a clad layer of the optically pumped laser structure, wherein the material comprises one or more of GaSb, AlGaSb, AlAsSb, AlGaAsSb, InAlAsSb, GaAlAsSb, AlSb, AlInSb, AlSbAs, or AlGaSbAs.

8. The device of claim 1, wherein the optically pumped laser structure comprises an edge emitting laser structure that comprises one or more lasing facets, wherein each lasing facet comprises one of an anti-reflection coating to improve a transmission of the pump beam or a high reflectivity coating to direct the lasing emission.

9. The device of claim 1, wherein the chirped DFB grating is formed by an interferometric lithography technique.

10. The device of claim 1, wherein the chirped DFB grating comprises a continuously-varying grating period.

11. The device of claim 1, further comprising a discrete set of DFB gratings that each DFB grating comprises a fixed grating period and the chirp is realized in different fixed grating periods.

12. The device of claim 1, wherein the optically pumped laser structure employs one or more type-II quantum well active regions for generating mid-IR lasing photons.

13. The device of claim 1, wherein the pump beam comprises a wavelength ranging from about 1.6 micrometer to about 2.7 micrometer.

14. A method for tuning a laser emission wavelength comprising:
providing an optically pumped laser structure;
forming a chirped distributed feed-back (DFB) grating on the optically pumped laser structure using an interferometric lithography; and
changing a position of a pump beam relative to the chirped DFB grating to tune a laser emission wavelength.

15. The method of claim 14, further comprising,
directing the pump beam to sample a first DFB grating pitch, and
changing the position of the pump beam to sample a second DFB grating pitch.

16. The method of claim 14, further comprising continuously changing the relative position of the pump beam.

17. The method of claim 14, wherein the DFB grating is angled with respect to a reflecting edge of an optically pumped edge emitting laser structure.

18. The method of claim 14, further comprising rotating the pump beam with respect to a lasing facet of an optically pumped edge emitting laser structure in order to sample a plurality of varying grating pitches within the chirped DFB grating.

19. The method of claim 14, further comprising forming the chirped DFB grating by the interferometric lithography technique using the interference of two spherical waves.

20. The method of claim 14, further comprising forming the chirped DFB grating using one or more techniques chosen from an optical lithography, an electron-beam lithography, a nanoimprint technique, and an interferometric lithography.

21. A laser source for gas sensing comprising:
a chirped DFB grating disposed on an optically pumped laser structure, wherein the optically pumped laser structure emits in a mid-IR wavelength range; and
an optical arrangement comprising a pump beam that samples the chirped DFB grating at a plurality of locations, such that a single longitudinal mode emission is tuned to perform a spectroscopy of an absorbing media.

22. The laser source of claim 21, wherein the single longitudinal mode emission has an output power of about 300 mW/facet or higher.

23. The laser source of claim 21, wherein the single longitudinal mode emission has a narrow linewidth of about 0.17 nm to about 1.2 nm.

24. The laser source of claim 21, further comprising a plurality of optically pumped type-II quantum well laser structures that are optically connected to provide a broader gain bandwidth for a wide frequency scanning during a gas sensing.

* * * * *